US008964442B2

(12) United States Patent
Lung

(10) Patent No.: US 8,964,442 B2
(45) Date of Patent: Feb. 24, 2015

(54) INTEGRATED CIRCUIT 3D PHASE CHANGE MEMORY ARRAY AND MANUFACTURING METHOD

(71) Applicant: Macronix International Co., Ltd., Hsinchu (TW)

(72) Inventor: Hsiang-Lan Lung, Ardsley, NY (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/865,636

(22) Filed: Apr. 18, 2013

(65) Prior Publication Data

US 2014/0198553 A1    Jul. 17, 2014

Related U.S. Application Data

(60) Provisional application No. 61/751,954, filed on Jan. 14, 2013.

(51) Int. Cl.
*G11C 5/06* (2006.01)
*G11C 13/00* (2006.01)

(52) U.S. Cl.
CPC .................................. *G11C 13/0004* (2013.01)
USPC ...... 365/63; 365/163; 365/148; 365/189.011; 257/208

(58) Field of Classification Search
USPC .............. 365/163, 148, 189.011, 63; 257/208
See application file for complete search history.

(56) References Cited

U.S. PATENT DOCUMENTS

| 3,922,648 | A | 11/1975 | Buckley |
|---|---|---|---|
| 4,225,946 | A | 9/1980 | Neale et al. |
| 4,228,524 | A | 10/1980 | Neale et al. |
| 5,341,328 | A | 8/1994 | Ovshinsky et al. |
| 6,762,952 | B2 | 7/2004 | Munden et al. |
| 6,768,665 | B2 | 7/2004 | Parkinson et al. |
| 6,781,906 | B2 | 8/2004 | Perner et al. |
| 6,927,411 | B2 | 8/2005 | Kozicki |
| 7,085,154 | B2 | 8/2006 | Cho et al. |
| 7,190,607 | B2 | 3/2007 | Cho et al. |
| 7,289,351 | B1 | 10/2007 | Chen et al. |
| 7,365,355 | B2 | 4/2008 | Parkinson |
| 7,505,330 | B2 | 3/2009 | Pawlowski et al. |
| 7,539,050 | B2 | 5/2009 | Philipp et al. |

(Continued)

OTHER PUBLICATIONS

Papandreou N et al., "Drift-resilient cell-state metric for multilevel phase-change memory," IEEE IEDM, Dec. 5-7, 2011, pp. 3.5.1-3.5.4.

*Primary Examiner* — Fernando Hidalgo
(74) *Attorney, Agent, or Firm* — Haynes Beffel & Wolfeld LLP

(57) ABSTRACT

A 3D phase change memory device can store multiple bits per cell represented by a plurality of non-overlapping ranges of resistance all of which are established by different resistance ranges corresponding to respective amorphous phase thickness of the phase change memory material. An array of access devices can underlie a plurality of conductive layers, separated from each other and from the array of access devices by insulating layers. An array of pillars extending through the plurality of conductive layers contact corresponding access devices. The phase memory material is between the pillars and conductive layers. Circuitry is configured to program data in the memory cells using programming pulses having shapes that depend on the resistance range of the cell before programming and the data values to be stored.

17 Claims, 15 Drawing Sheets

(56) References Cited

U.S. PATENT DOCUMENTS

| | | |
|---|---|---|
| 7,558,105 B2 | 7/2009 | Suh |
| 7,571,901 B2 | 8/2009 | Philipp |
| 7,577,024 B2 | 8/2009 | Fackenthal et al. |
| 7,580,277 B2 | 8/2009 | Fuji |
| 7,656,701 B2 | 2/2010 | Lee et al. |
| 7,679,954 B2 | 3/2010 | Lee et al. |
| 7,751,227 B2 | 7/2010 | Fuji |
| 7,764,533 B2 | 7/2010 | Breitwisch et al. |
| 7,767,993 B2 | 8/2010 | Toda et al. |
| 7,796,424 B2 | 9/2010 | Happ et al. |
| 7,826,248 B2 | 11/2010 | Xi et al. |
| 7,830,701 B2 | 11/2010 | Siau et al. |
| 7,863,594 B2 | 1/2011 | Akinaga et al. |
| 7,867,804 B2 | 1/2011 | Lee |
| 8,406,033 B2 | 3/2013 | Lung et al. |
| 2003/0002331 A1 | 1/2003 | Park et al. |
| 2005/0275433 A1 | 12/2005 | Lee |
| 2006/0034112 A1 | 2/2006 | Oh et al. |
| 2007/0140029 A1 | 6/2007 | Kim et al. |
| 2008/0019170 A1 | 1/2008 | Happ et al. |
| 2008/0048167 A1 | 2/2008 | Kostylev et al. |
| 2008/0175032 A1 | 7/2008 | Tanaka et al. |
| 2009/0008636 A1 | 1/2009 | Lee |
| 2009/0250678 A1 | 10/2009 | Osano et al. |
| 2009/0273968 A1 | 11/2009 | Lamorey et al. |
| 2010/0038614 A1 | 2/2010 | Hampton |
| 2010/0054015 A1 | 3/2010 | Lee et al. |
| 2010/0214829 A1 | 8/2010 | Breitwisch et al. |
| 2010/0270593 A1* | 10/2010 | Lung et al. .................... 257/208 |
| 2010/0328995 A1 | 12/2010 | Shih et al. |
| 2011/0013446 A1 | 1/2011 | Lung |
| 2011/0116309 A1* | 5/2011 | Lung ............................ 365/163 |
| 2011/0235408 A1* | 9/2011 | Minemura et al. ............ 365/163 |
| 2012/0326111 A1 | 12/2012 | Cheng et al. |

\* cited by examiner

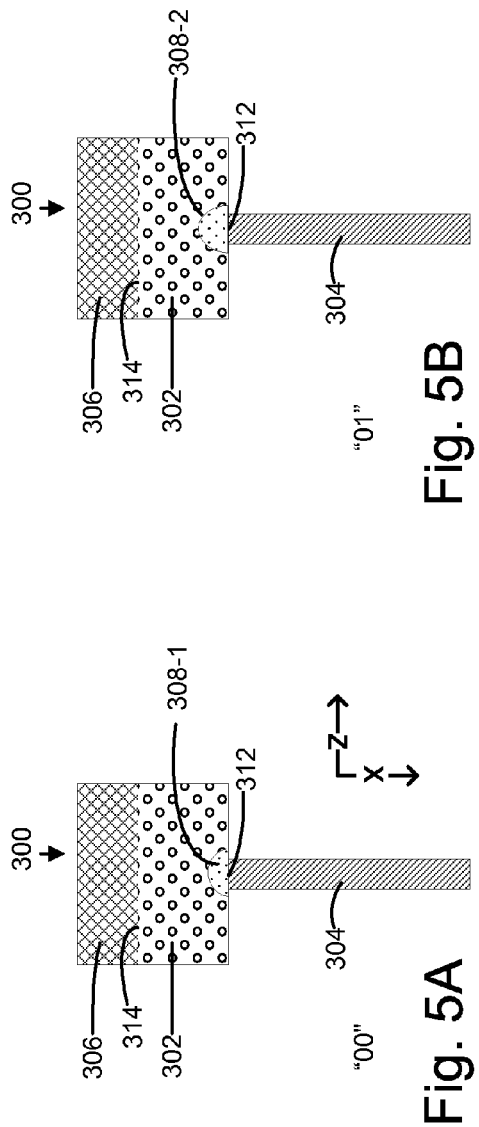
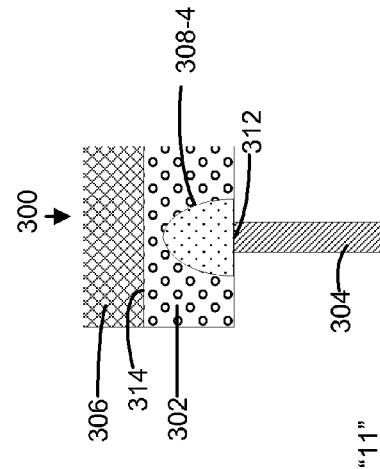
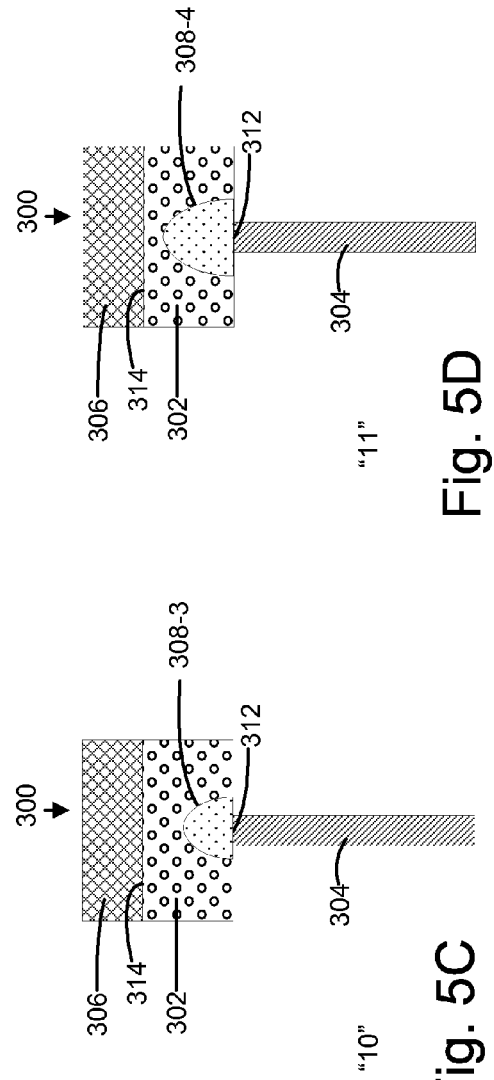

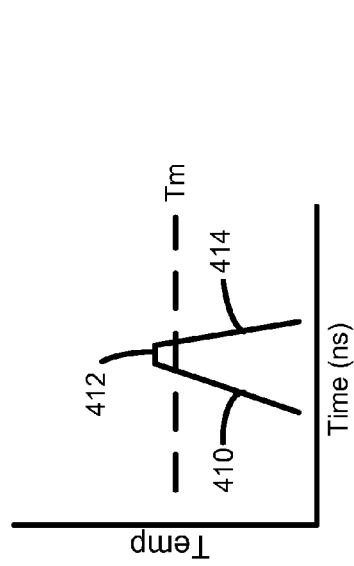
Fig. 6A (to 00)
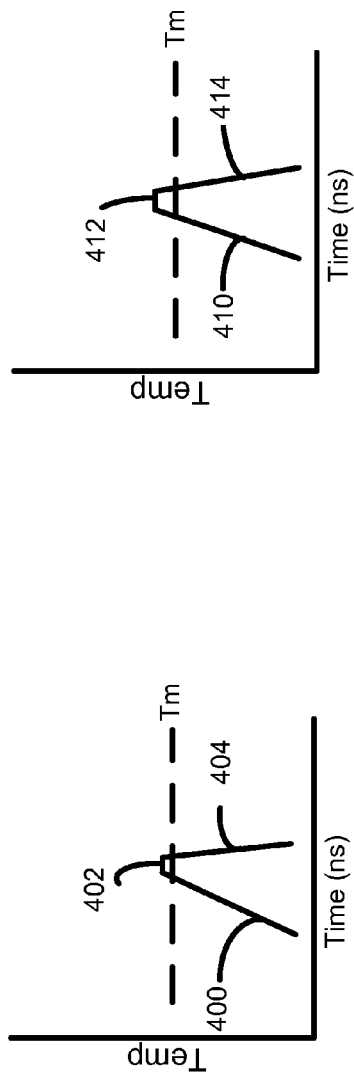
Fig. 6B (to 01)
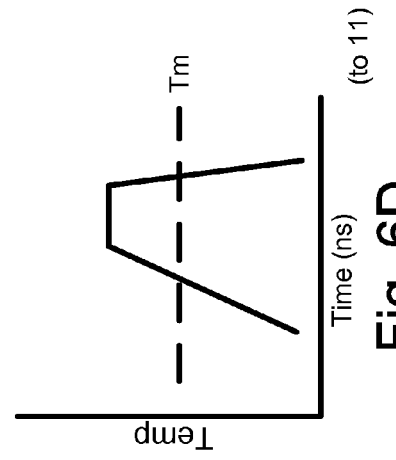
Fig. 6C (to 10)
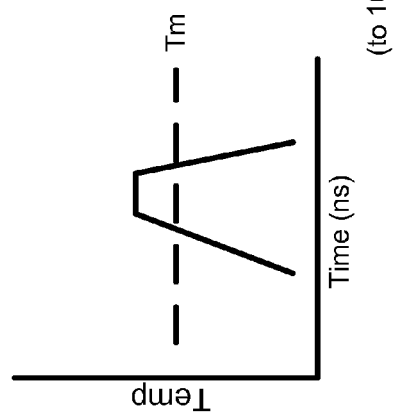
Fig. 6D (to 11)

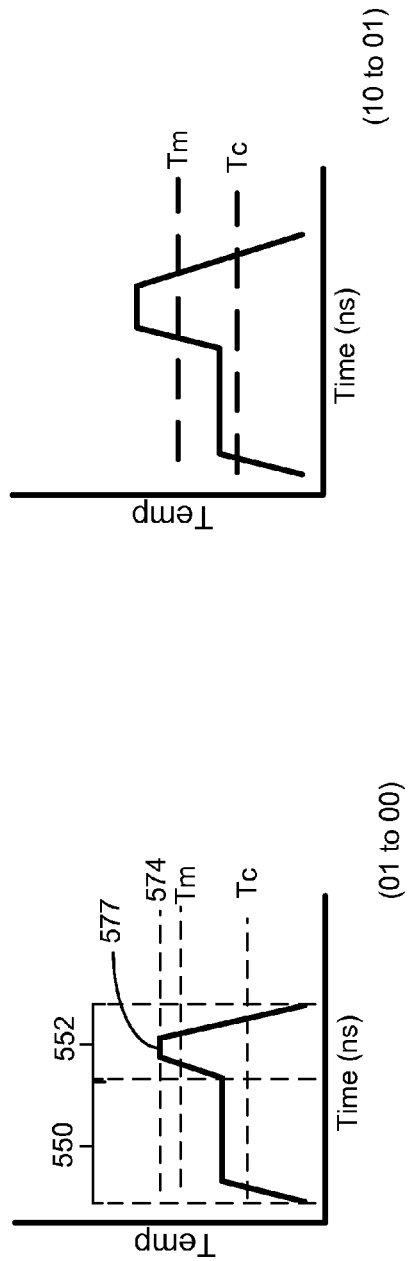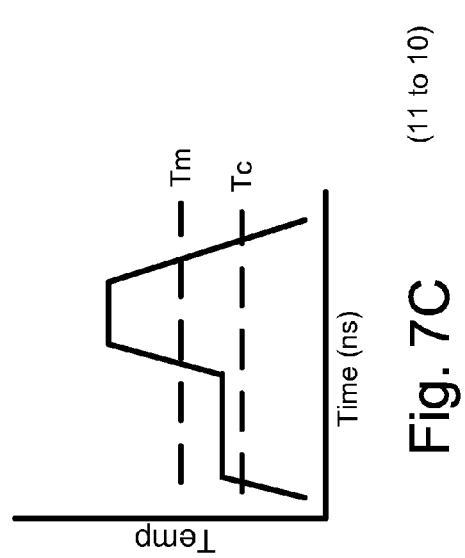

US 8,964,442 B2

INTEGRATED CIRCUIT 3D PHASE CHANGE MEMORY ARRAY AND MANUFACTURING METHOD

RELATED APPLICATIONS

This application claims benefit of U.S. Provisional Patent Application No. 61/751,954 filed on 14 Jan. 2013, which application is incorporated by reference as if fully set forth herein.

BACKGROUND OF THE INVENTION

1. Field of the Invention

The present invention relates to high density memory devices, and particularly to memory devices in which multiple planes of memory cells are arranged to provide a three-dimensional 3D array.

2. Description of Related Art

As critical dimensions of devices in integrated circuits shrink, designers have been looking to techniques for stacking multiple planes of memory cells to achieve greater storage capacity, and to achieve lower costs per bit. In one technology, a plurality of conductive planes of conductors is intersected by an array of conductive pillars. Individual memory cells are selected by selecting the corresponding pillar and conductive plane. These technologies, however, require a rectifier or diode at each memory cell in the array, which complicates the manufacturing processes and increases costs. See, for example, U.S. Patent Application Publication No. US 2010-0270593-A1 entitled Integrated Circuit 3d Memory Array And Manufacturing Method.

It is desirable to provide a structure for three-dimensional integrated circuit memory with a low manufacturing cost, including reliable, very small memory elements.

SUMMARY

A memory cell described herein comprises phase change memory material in an interface between the first and second conductors, wherein data stored in the memory cell is represented only by different non-zero thicknesses in an amorphous phase of the phase change memory material, and no data stored in the memory cell is represented only by a crystalline phase of the phase change memory material Also described is a 3D phase change memory device which can store one or more bits per cell represented by a plurality of non-overlapping ranges of resistance all of which are established by different resistance ranges corresponding to respective amorphous phase thicknesses of the phase change memory material. In an array structure described herein, an array of access devices can underlie a plurality of conductive layers, separated from each other and from the array of access devices by insulating layers. An array of pillars extends through the plurality of conductive layers contact corresponding access devices. The phase memory material is between the pillars and conductive layers. Circuitry is configured to program data in the memory cells using programming pulses having shapes that depend on the resistance range of the cell before programming and the data values to be stored.

A method for manufacturing such devices is described as well.

A method for operating a memory device is described, which comprises receiving data to program to a selected phase change memory cell, the data having one of a plurality of data values to be stored in the selected cell, where all of said plurality of data values are represented by resistance ranges established in the phase change memory cell that are achieved using corresponding thicknesses of amorphous phase change material across the current paths of the cells. The method includes applying a programming pulse through the selected phase change memory cell, the current pulse being configured to program data in the memory cells having data values represented by a plurality of non-overlapping ranges of resistance, said plurality of non-overlapping ranges of resistance including a lowest resistance range of resistance, being established by respective amorphous phase thicknesses of the phase change memory material in the memory cells. The method is suitable for use with 3D cells as described herein.

Other aspects and advantages of the present invention can be seen on review of the drawings, the detailed description and the claims, which follow.

BRIEF DESCRIPTION OF THE DRAWINGS

FIGS. 5A-5D are cross-sectional views of the individual memory cells of the multi-level memory structure shown in FIG. 1 with variant amorphous phase volumes of phase change material which represent stored data.

FIGS. 6A-6D are graphs of the temperature versus time in active regions in memory cells representing applied pulses used to cause respective amorphous phase volumes, for transitions from lower to higher volumes.

FIGS. 7A-7C are graphs of the temperature versus time in active regions in memory cells representing applied pulses used to cause respective amorphous phase volumes, for transitions from higher to lower volumes.

DETAILED DESCRIPTION

A detailed description of embodiments of the present invention is provided with reference to the FIGS. 1-17.

Figures 1, 2:
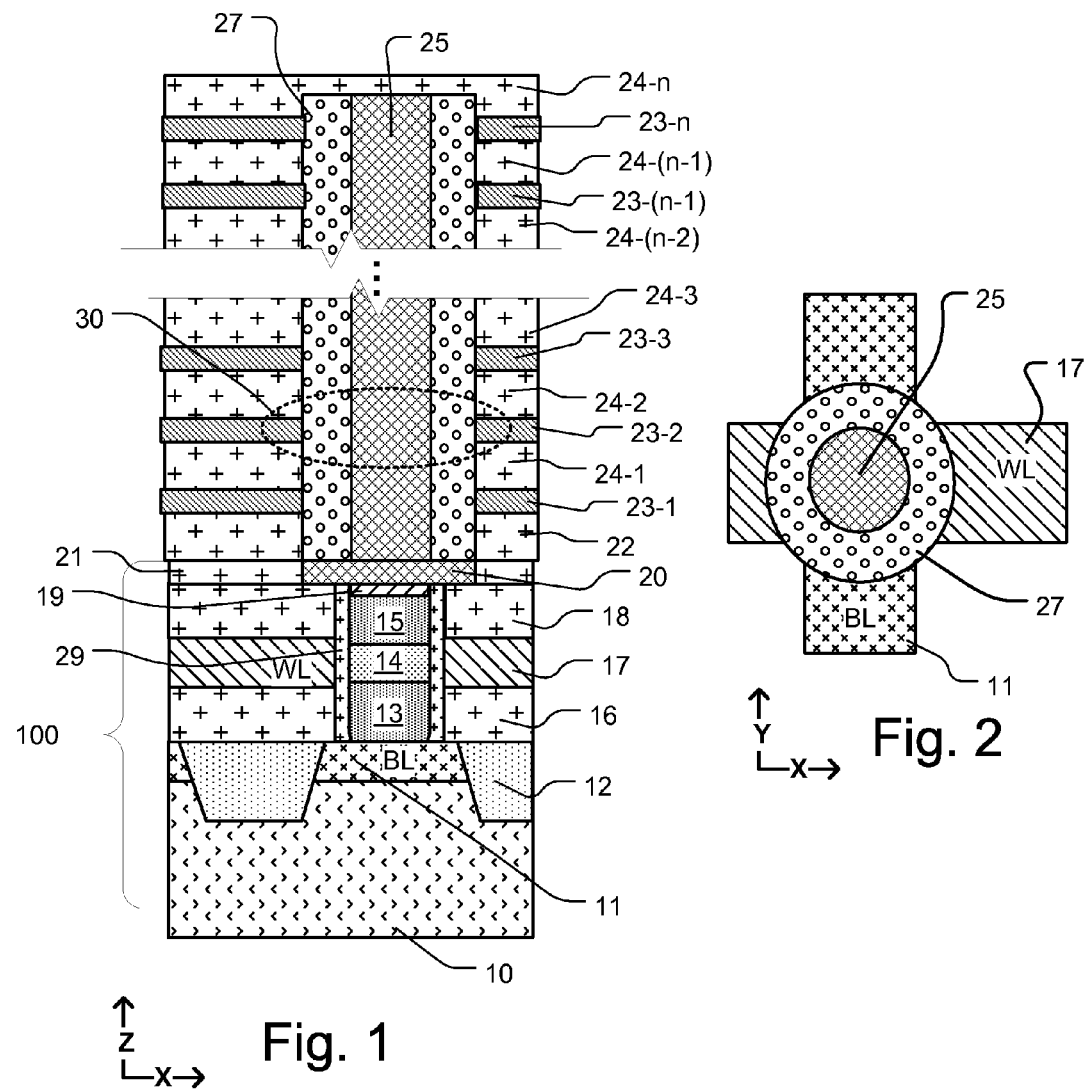
FIG. 1 is a cross-section of a multi-level memory cell structure.
FIG. 2 shows a top view layout of a pillar and the layer of memory material according to one embodiment of the multi-level memory cell structure.

FIG. 1 illustrates a cross-section of a multi-level memory cell structure. The memory cell is formed on an integrated circuit substrate that in this example includes an access array.

The access array comprises access devices which in this example are part of an integrated circuit substrate including a memory cell access layer 100, and arranged to connect to individual pillars (e.g., a pillar including pillar core 25 and liner 27) in an array of pillars.

The access array in this example includes a semiconductor body 10 with trench isolation structures 12 patterned in lines on the surface. Between the trench isolation structures 12, implants are deposited to form buried diffusion bit lines 11 extending in this view into and out of the page of the drawing. An access device for a pillar core 25 is shown which consists of a vertical FET transistor having a drain 13, a channel 14, and a source 15 surrounded by a gate dielectric layer 29. An insulating layer 16 overlies the semiconductor body 10. A word line 17 traverses the array and surrounds the channel 14 of the vertical FET. An insulating layer 18 overlies the word line in this example. A silicide layer 19 is formed on top of the source 15. In this example, a contact pad 20 (such as a layer of refractory metal like tungsten) is defined and patterned on the silicide layer 19. An insulating layer, including in this example layer 21 and layer 22, overlies the contact pad 20. The parts of the structure shown in the figure from the contact pad 20 to the semiconductor bodies 10 (e.g. bulk silicon) are part of an integrated circuit substrate including the memory cell access layer 100.

A plurality of conductive layers 23-1 through 23-$n$ overlies the contact pad 20 and insulating layer 22. Insulating layers 24-1 through 24-($n$-1) separate the conductive layers 23-1 through 23-$n$ from one another. Insulating layer 24-$n$ covers the top conductive layer 23-$n$. In alternative embodiments, the array of access devices may be formed over the plurality of conductive layers, or between conductive layers, using thin film transistor techniques for example.

A pillar including core 25 and liner 27 extends through the plurality of conductive layers 23-1 through 23-$n$ and the plurality of insulating layers 24-1 through 24-($n$-1). The pillar comprises a conductive core 25 and a liner 27 of phase change material. The conductive core 25 can comprise a metal, a non-metal conductor like titanium nitride, or a low resistance phase change material. When the core 25 comprises a phase change material, the liner 27 can comprise the same phase change material (in which case the core 25 and the liner 27 can be a unitary body), the same phase change material as modified by additives or dopants, or other phase change materials.

Ring-shaped interface regions, such as the region 30, occur in the cross-points between the plurality of conductive layers 23-1 through 23-$n$ and the pillar liner 27. The phase change material of the liner 27 is disposed in the interface regions, and acts as a memory element for a stack of memory cells on the pillar. The memory elements of the individual cells provide current paths between corresponding conductive layers and a pillar, and are configured to store data values established by different amorphous phase thicknesses of the phase change memory material in the memory cells The phase change material forming the liner 27 is characterized by having a relatively high resistivity, amorphous solid phase and a relatively low resistivity (relative to the amorphous phase resistivity), crystalline solid phase. In one embodiment, the liner 27 comprises a phase change material like germanium-rich $Ge_xSb_yTe_z$, which has a relatively high resistivity in an as-deposited crystalline phase. This facilitates initialization of the memory array by limiting leakage current, during transition from a condition as formed in which the memory cells may include cells having only crystalline phase material, to a working condition in which all memory cells comprise an amorphous phase volume that provides inter-layer leakage current protection during operation of the device, by applying reset pulses to the memory cells.

The plurality of conductive layers 23-1 through 23-$n$ are configured to act as heater electrodes for the phase change memory elements in the interface regions, where the heater electrode can be defined as an electrode which is configured by comprising a relatively high resistivity conductor, like titanium nitride, or by small contact area, or both, to achieve temperatures and current densities needed to change the resistance states of the phase change material. In an alternative configuration, the plurality of conductive layers 23-1 through 23-$n$ can comprise phase change material, and the memory pillar can be configured to act as a heater electrode.

There is no additional access device, such as a diode, in the interface regions in this structure. Rather, the memory cells are all operated so that they maintain a minimum volume of amorphous phase material in the active regions, which provide different amorphous phase thicknesses of the phase change memory material across the current paths, so that they have a relatively high resistance even in the lowest resistance state used to represent a data value. The relatively high resistance of the memory cell in all states corresponding to a data value acts to block leakage current during access to other memory cells. This structure forms a basis array unit for all amorphous 3D phase change memory cells, which can store one or more bits per cell, where each data value corresponds to a different thickness of the amorphous phase volume across the current path of the cell. No data value is represented in this configuration, by a condition including an only crystalline phase material in the current path between the corresponding conductive layer and the pillar.

To access a memory cell, one word line and one bit line, in the access layer, and one conductive layer will be decoded. Different program/erase pulses are applied to the selected cell through the transistor in the access layer and conductive layer. Information is read by determining the size of the amorphous volume in the selected memory cell, by sensing a resistance range, such as described in Papandreou, et al. *Drift-Resilient Cell-State Metric for Multilevel Phase Change Memory*, IEEE, IEDM, 5-7 Dec. 2011, p. 3.5.1-3.5.4.

FIG. 2 shows a top view layout of a pillar core 25 and the liner 27 of phase change material like that shown in FIG. 1 on an access device, with the conductive layers omitted from the drawing. A liner 27 of memory material is annular and surrounds the pillar core 25. The bit lines 11 in the access layer are laid out in a first direction, and the word lines 17 in the access layer are laid out in an orthogonal direction. The ring-shaped interfaces between the pillar liner 27 and each of the layers of conductive material (not shown) define the interface regions that include the programmable memory elements.

Figure 3:
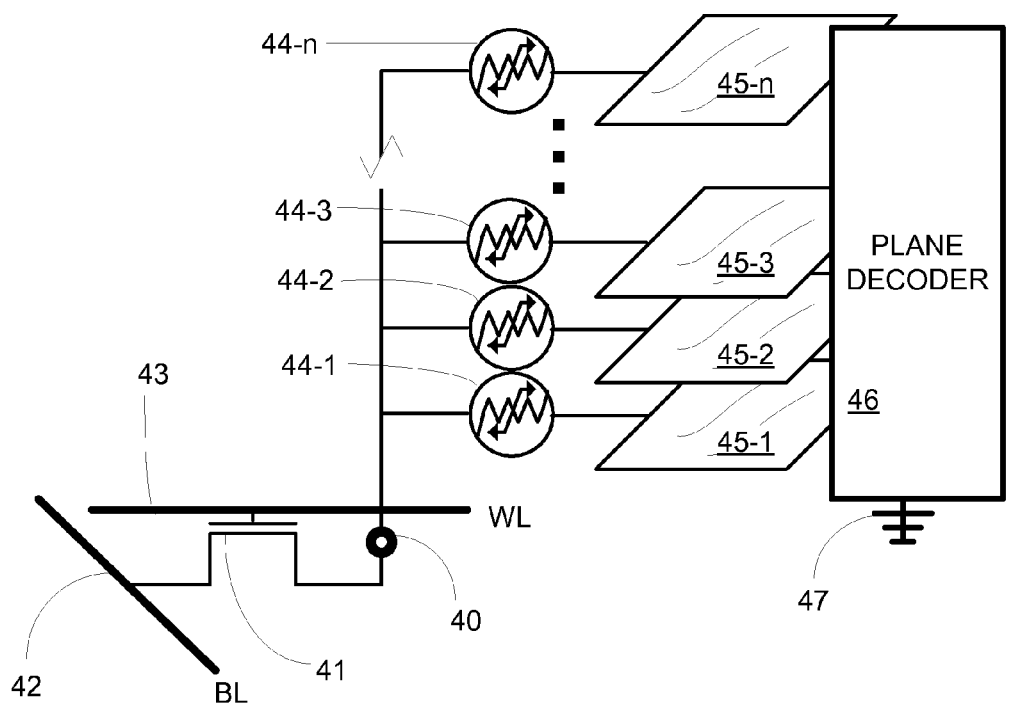
FIG. 3 is a schematic illustration of the structure of FIG. 1.

FIG. 3 is a schematic illustration of the structure of FIG. 1. A pillar 40 is coupled to an access transistor 41 which is selected using the bit line 42 and word line 43. A plurality of memory elements 44-1 through 44-$n$ are connected to the pillar 40.

Each of the memory elements 44-1 through 44-$n$ is coupled to corresponding conductive planes 45-1 through 45-$n$, where the conductive planes are provided by the conductive layers of material described herein. A plane decoder 46 is coupled to the planes, and is arranged to connect a selected plane to a reference potential such as ground 47. Sense amplifiers coupled to the bit lines (e.g. bit line 42) are configured to sense the range of resistance within which the resistance of selected cell falls, to indicate the data value.

Figure 4:
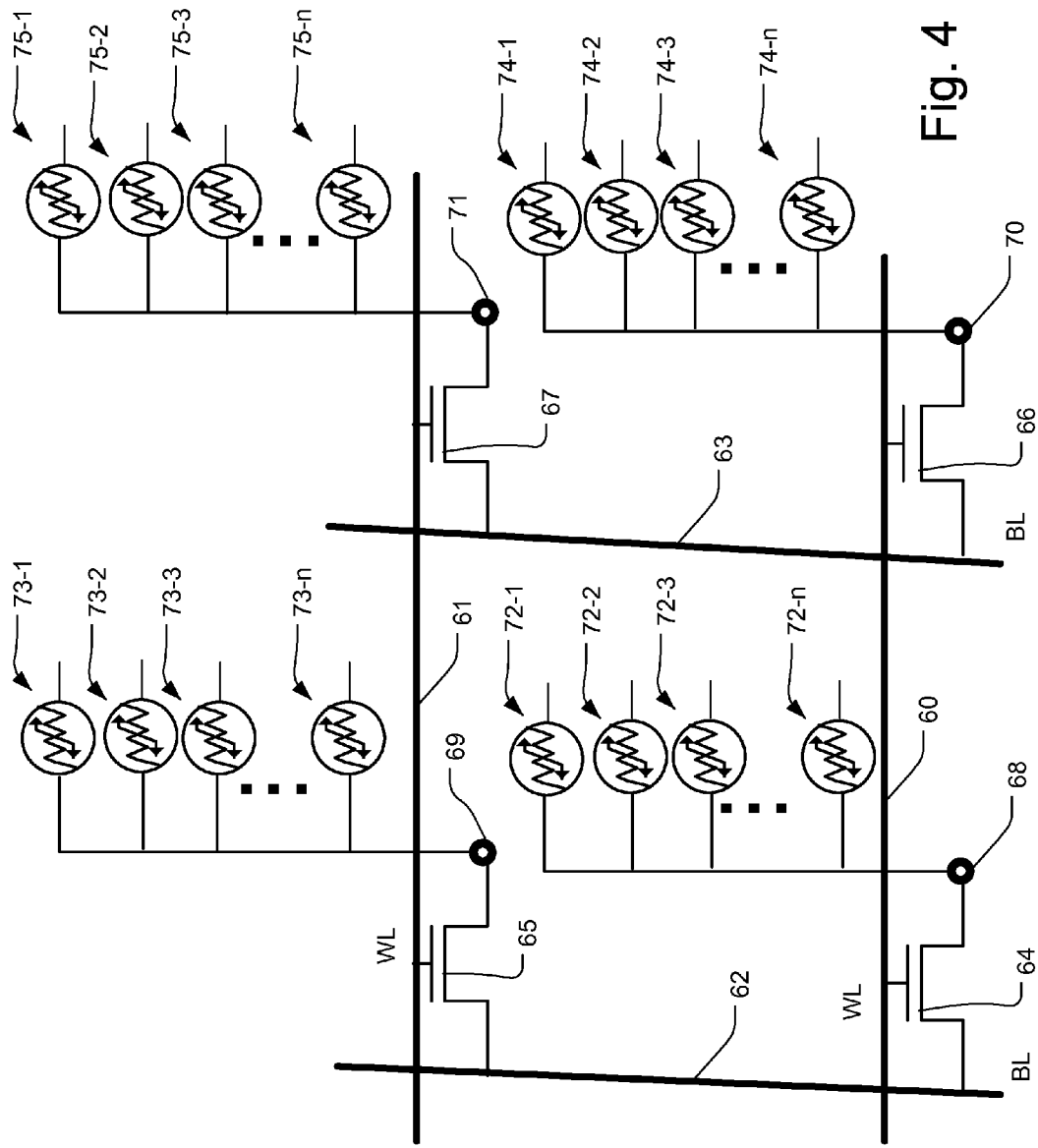
FIG. 4 is a schematic representation of a four-pillar portion of a three-dimensional 3D memory array like that of FIG. 3.

FIG. 4 is a schematic representation of a 2-by-2 portion of an array of pillars, like that of FIG. 3, with memory cells configured in a three-dimensional 3D memory array. The access array includes word lines 60 and 61, and bit lines 62 and 63. Access devices 64, 65, 66 and 67 lie at the cross-points between the bit lines and the word lines. Each access device is coupled to a corresponding pillar 68, 69, 70, 71. Each pillar includes a stack of memory elements that is a number "n" planes deep. Thus, pillar 68 is coupled to memory elements 72-1 through 72-n. Pillar 69 is coupled to memory elements 73-1 through 73-n. Pillar 70 is coupled to memory elements 74-1 through 74-n. Pillar 71 is coupled to memory elements 75-1 through 75-n. The conductive layers are not illustrated in FIG. 4 to avoid crowding the drawing. The 2-by-2 array shown in FIG. 4 can be extended to arrays that are thousands of word lines by thousands of bit lines with any number of planes. In representative embodiments, the number n of planes can be powers of 2 to facilitate binary decoding, such as 4, 8, 16, 32, 64, 128 and so on.

FIGS. 5A-5D illustrate amorphous phase volumes in the memory cells, that are used to represent data values in the memory structure described herein. The various amorphous phase volumes having different thicknesses of amorphous phase material across the current path of the cells, result in memory cell resistances that fall within a set of resistance ranges that correspond to particular data values. In this set of figures, the illustrated cell 300 includes a phase change memory element 302 disposed between a first heater electrode 304 and second electrode 306. The first and second electrodes 304 and 306 correspond to one of the plurality of conductive layers and the pillar, like those shown in FIG. 1. The first heater electrode 304 contacts the phase change memory element at a surface 312, which can be the ring shaped interface between a conductive layer and the pillar. The second electrode 306 contacts the phase change material at a surface 314 which can be the surface of the pillar, and which can be larger than the surface 312 in order to concentrate current at the surface 312.

In FIG. 5A, the phase change memory element 302 comprises a phase change material in a current path between the first and second electrodes 304 and 306, a portion of which is an amorphous phase volume 308-1, which causes the cell to fall within a first resistance range that can correspond to a data value of "00." In FIG. 5B, the amorphous phase volume 308-2, is larger than the volume 308-1, and causes the cell to fall within a second resistance range higher than the first resistance range, and can correspond to a data value of "01." In FIG. 5C, the amorphous phase volume 308-3, is larger than the volume 308-2, and causes the cell to fall within a third resistance range higher than the first and second resistance ranges, and can correspond to a data value of "10." In FIG. 5D, the amorphous phase volume 308-4, is larger than the volume 308-3, and causes the cell to fall within a fourth resistance range higher than the first, second and third resistance ranges, and can correspond to a data value of "11." Of course, the memory cells can be configured to store only one bit per cell, and to store any amount of data per cell.

A memory device comprising the 3D array described herein includes circuitry configured to program data is configured to apply a program pulse to a selected memory cell having a pulse shape that depends on the resistance range (i.e. starting amorphous phase thickness) of the memory cell before applying the program pulse, and the target resistance range (i.e. ending amorphous phase thickness) for the memory cell after the programming pulse. Such circuitry can include logic to determine a resistance range of a selected memory cell, such as a pre-program read sequence, and a pulse forming circuit to generate a program pulse having a pulse shape selected in response to the determined resistance and a target resistance range.

FIGS. 6A-6D are graphs of the temperature versus time in active regions that roughly correspond to pulse shapes that can be applied, as selected by the control logic to establish amorphous phase thickness of various sizes in the memory cells for the structure described herein. FIG. 6A represents a pulse shape having a relatively steep leading edge 600 which increases to a peak 602 and then drops quickly on the trailing edge 604. The peak 602 is specified at a level that achieves a temperature in the phase change material that exceeds the melting temperature $T_m$, for a relatively short duration. This pulse is designed to initialize a memory cell from an as manufactured initial state which may be dominated by crystalline phase material to a condition in which the amorphous phase volume establishes a first range of resistance that can correspond to a data value such as "00." The relatively short duration of time above the melting temperature, and a quick drop caused by steep trailing edge 604 results in an amorphous phase volume sufficient to cover the contact area between the horizontal conductors and the phase change material, while leaving a relatively large amount crystalline material in the memory element as illustrated in FIG. 5A for example.

FIG. 6B represents a pulse shape of the same basic configuration as that of FIG. 6A with a relatively steep leading edge 610, which increases to a peak 612 and drops quickly on the trailing edge 614. This pulse is designed so the peak 612 achieves a temperature in the phase change material that exceeds the melting temperature $T_m$ for an intermediate duration. The pulse is designed to transition a memory cell from a lower resistance range to a condition in which the amorphous phase volume establishes a second range of resistance that can correspond to the data value such as "01. The pulse shown in FIG. 6B results in an amorphous phase volume larger than that caused by the pulse of FIG. 6A, such as represented by FIG. 5B.

FIG. 6C represents a pulse shape of the same basic configuration as that of FIGS. 6A and 6B with a relatively steep leading edge, which increases to a peak and drops quickly on the trailing edge. This pulse is designed so the peak achieves a temperature in the phase change material that exceeds the melting temperature $T_m$ for a second, longer, intermediate duration. The pulse is designed to transition a memory cell from a lower resistance range to a condition in which the amorphous phase volume establishes a third range of resistance that can correspond to the data value such as "10." The pulse shown in FIG. 6C results in an amorphous phase volume larger than that caused by the pulse of FIG. 6B, such as represented by FIG. 5C.

FIG. 6D represents a pulse shape of the same basic configuration as that of FIGS. 6A, 6B and 6C with a relatively steep leading edge, which increases to a peak and drops quickly on the trailing edge. This pulse is designed so the peak achieves a temperature in the phase change material that exceeds the melting temperature $T_m$ for a longest duration in this pulse set. The pulse is designed to transition a memory cell from a lower resistance range to a condition in which the amorphous phase volume establishes a fourth range of resistance that can correspond to the data value such as "11". The pulse shown in FIG. 6D results in an amorphous phase volume larger than that caused by the pulse of FIG. 6C, such as represented by FIG. 5D.

The pulse shapes shown in FIGS. 6A through 6D are suitable for increasing the size of the amorphous phase volume in the memory cell. In order to cause the amorphous phase volume to decrease in size, a different pulse shape is required. FIG. 7A illustrates a pulse shape in the form of a graph of temperature versus time, which can be used to cause a transition from a higher resistance state, such as a resistance state corresponding to the data value of "01," to a resistance state based on a smaller amorphous volume corresponding to the data value of "00." The pulse includes a first portion 550 in which the temperature of the phase change volume is increased above a crystallization transition temperature $T_C$, and a second portion 552 in which the temperature of the phase change volume is rapidly increased to the peak 577 above the melting temperature. The amount of energy applied during the first portion of the pulse is configured to re-crystallize the amorphous phase volume in preparation for a second portion of the pulse which is configured to set the targeted amorphous phase volume for the pulse. The amount of energy applied above the melting temperature $T_m$ to the level 574 of the peak corresponds roughly to the amorphous phase volume that results.

FIG. 7B illustrates a pulse shape which can be used to cause a transition from a higher resistance state to a resistance state based on a smaller amorphous volume corresponding to the data value of "01." The pulse shape of FIG. 7B is configured in this example in the same basic manner as that of FIG. 7A. It differs in the amount of energy applied above the melting temperature in one example. Another example can differ in the length of the initial crystallization phase, as well as the amount of energy applied above the melting temperature.

FIG. 7C illustrates yet another pulse shape which can be used to cause a transition from a higher resistance state such as the state corresponding to the data value "11," to a lower resistance state represented by smaller amorphous phase volume corresponding to the data value of "10.". Again, the pulse shape of FIG. 7C is configured in this example in the same basic manner as that of FIGS. 7A and 7B. It differs in the amount of energy applied above the melting temperature in one example. Another example can differ in the length of the initial crystallization phase, as well as the amount of energy applied above the melting temperature.

It can be seen therefore that the programming of a memory device configured as described herein can include control logic that selects a pulse shape based on the initial state of the memory cell, and the target state.

Figure 8:
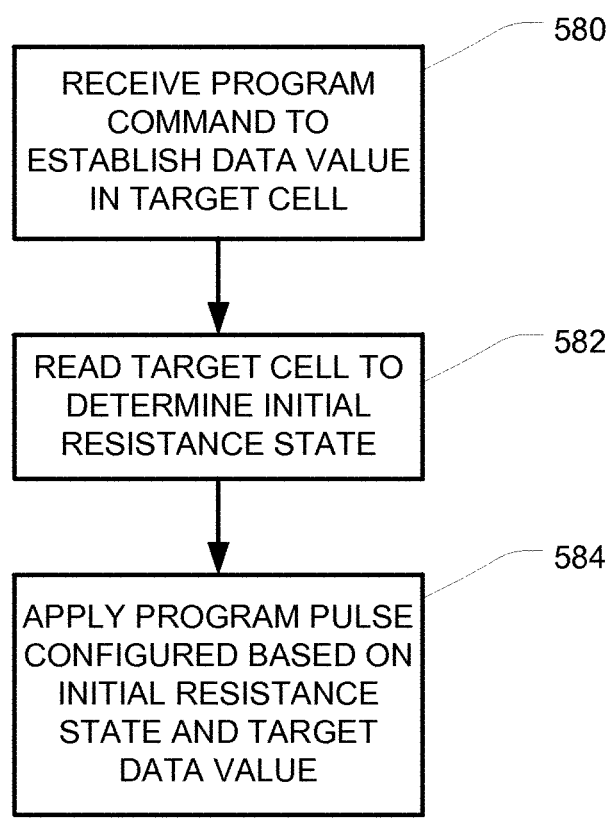
FIG. 8 illustrates function of control circuitry for programming phase change memory cells, where all data values are represented by amorphous phase volumes in phase change memory elements.

FIG. 8 is a flowchart which represents a control logic sequence that can be applied for programming a memory cell, which includes selecting a pulse shape based on the initial state of the cell, and the target state. A memory device including the 3D memory structure described herein can receive a program command to establish a particular data value in a target memory cell, or more typically a target word or page of memory cells (580). The controller for the device then executes a pre-program read operation, to determine the initial resistance state of the target memory cell, or cells (582). The controller then applies a program pulse which is configured based on the initial resistance state and the target data value for the cell (584), using an appropriate pulse shape as discussed above in connection with FIGS. 6A-6D and FIGS. 7A-7C.

Figure 9:
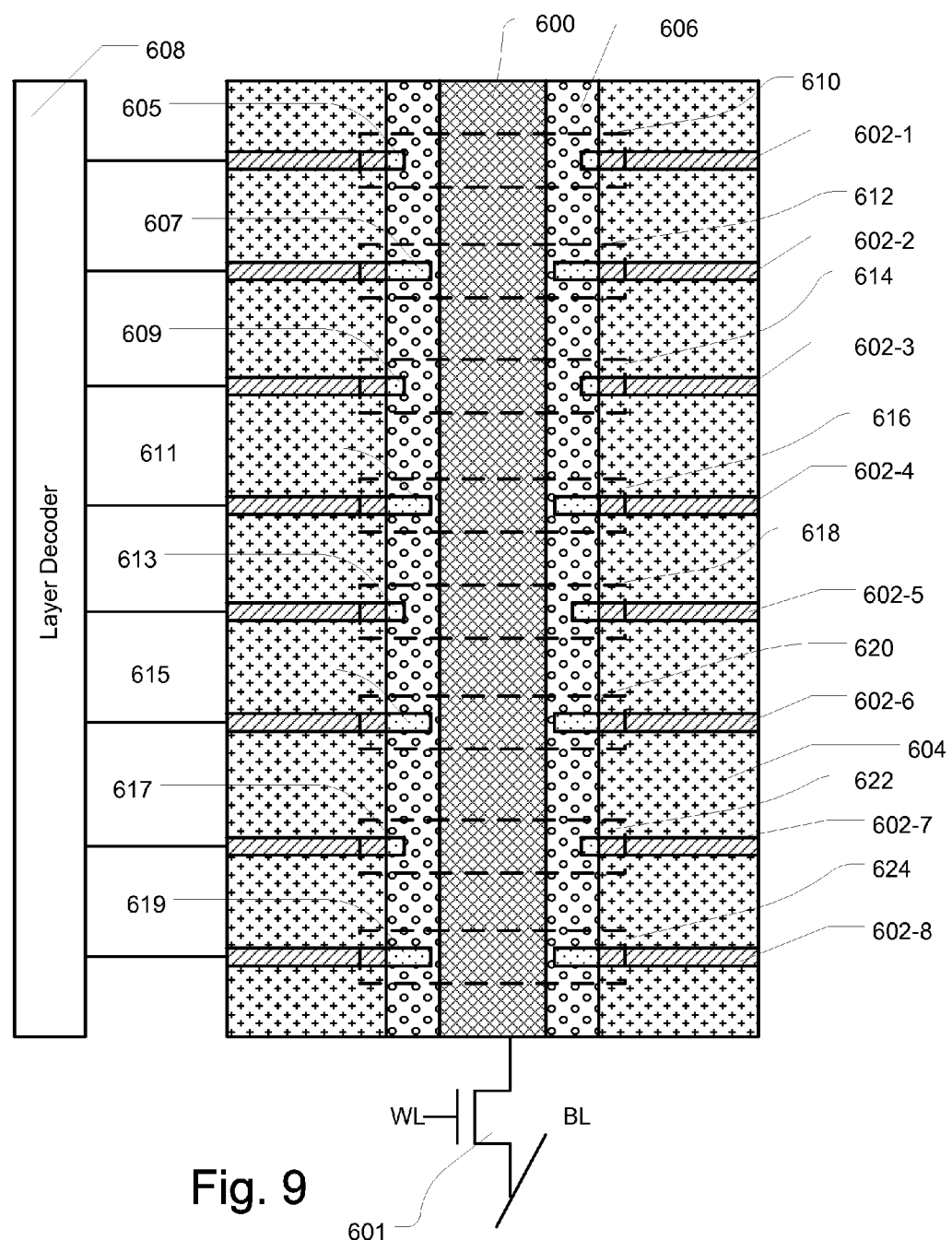
FIG. 9 is a cross-sectional view of a horizontal stacked memory structure with programmed memory cells, where the phase change material is disposed as a liner of the vertical pillar.

FIG. 9 shows a cross-sectional view of a stacked memory structure with memory cells programmed to have amorphous thicknesses of varying sizes. The varying sizes in amorphous thicknesses cause the cells have resistances that fall within different resistance ranges that correspond to the data values stored. The stacked memory structure includes a pillar 600 having a liner 606 of phase change material. The pillar 600 extends through a plurality of conductive layers 602-1 through 602-8 and a plurality of insulating layers (e.g. 604) separating the plurality of conductive layers. The programmable elements of each memory cell are located in a portion of memory material in a liner 606 of memory material that is in the cross-point between the pillar 600 and corresponding conductive layers in the plurality of conductive layers. Each of the conductive layers in the plurality of conductive layers is coupled to a layer decoder 608.

The stacked memory structure includes eight memory cells, in this example: 610, 612, 614, 616, 618, 620, 622 and 624. Memory cells are formed in the liner 606 between corresponding conductive layers 602-1 to 602-8 and the pillar 600. An access device 601 in the access layer is shown schematically for selecting the illustrated pillar. Also, a layer decoder 608 is illustrated for selecting a planar conductive layer.

The memory cells 610, 612, 614, 616, 618, 620, 622 and 624 each have a ring-shaped amorphous phase volume 605, 607, 609, 611, 613, 615, 617, and 619, of phase change material in the interface formed around the outside perimeter of the liner 606 at corresponding conductive layer 602-1 through 602-8. The resistance of each memory cell depends in part on the size of the amorphous phase volume. In this example, the memory cells 610, 614, 618 and 622 have a resistance that falls within a first resistance range which can correspond to a data value "0," as represented by the smaller size of the amorphous phase volumes 605, 609, 613 and 617. The memory cells 612, 616, 620 and 624 have a resistance that falls within a second, higher resistance range which can correspond to a data value "1", as represented by the larger size of the amorphous phase volumes 607, 611, 615 and 619.

Figure 10:
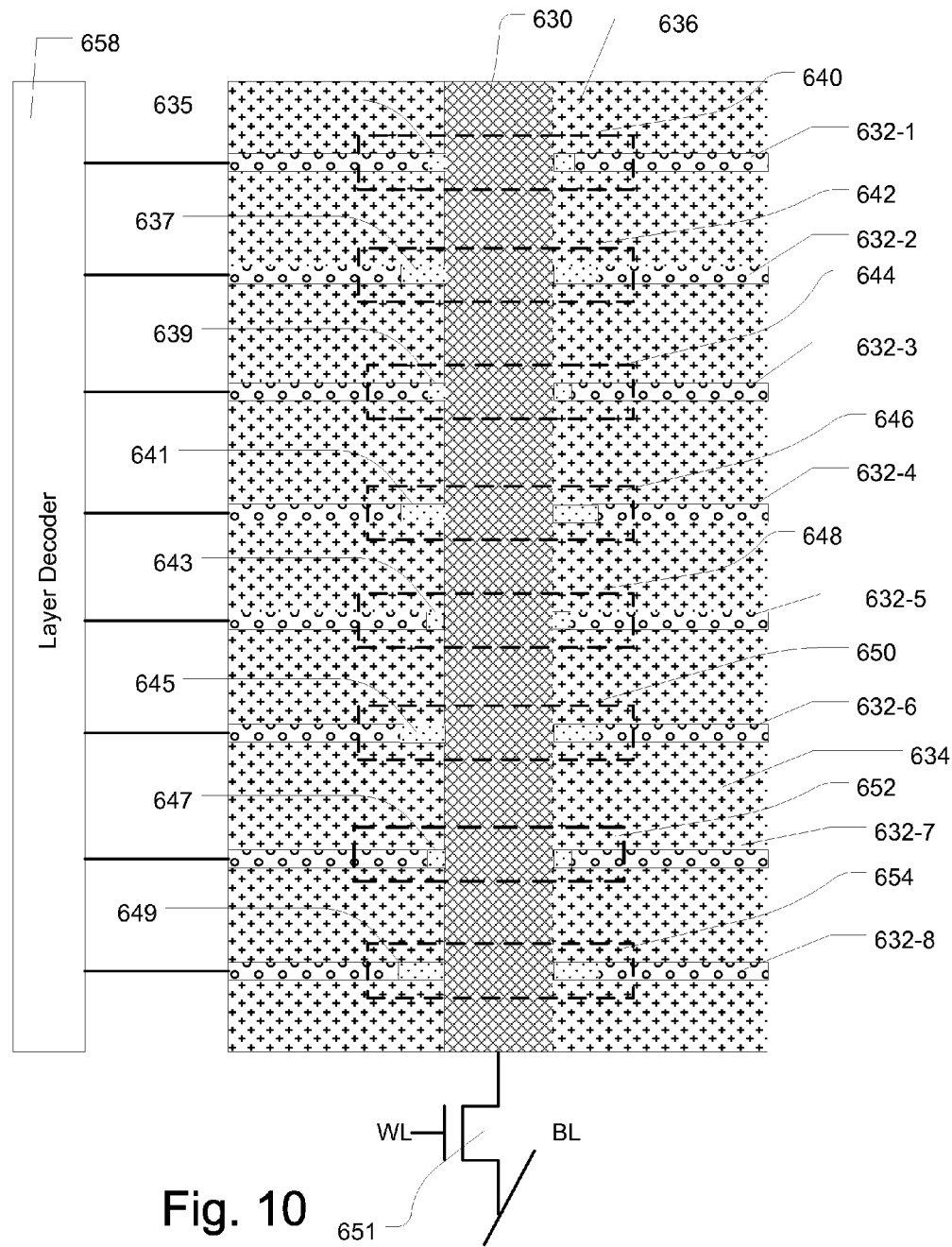
FIG. 10 is a cross-sectional view of a horizontal stacked memory structure with programmed memory cells in which the horizontal conductors comprise phase change material.
Figure 11:
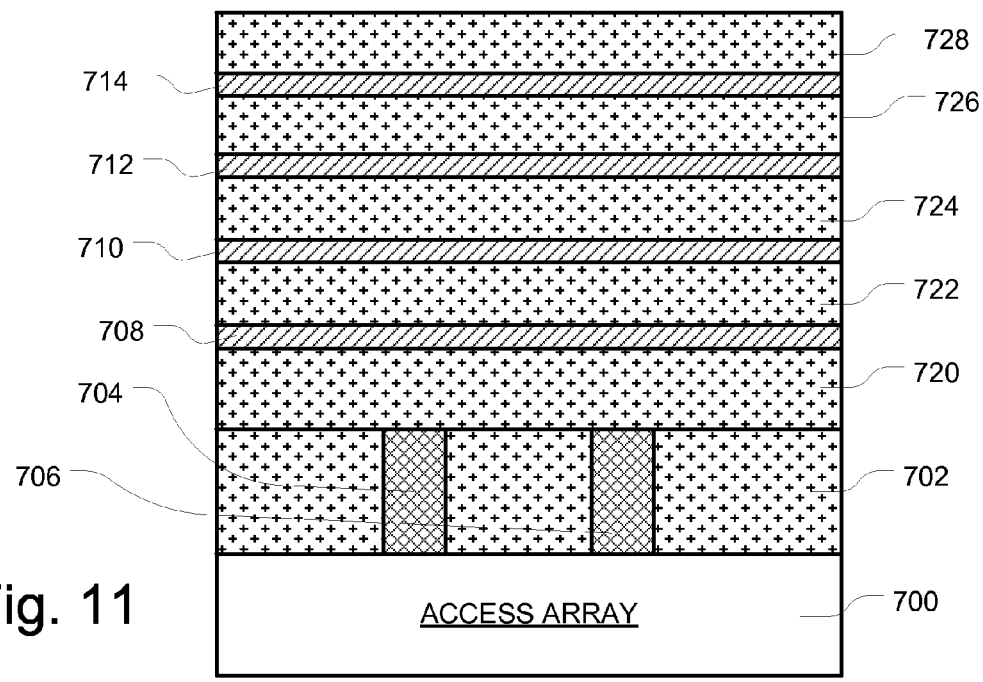
FIGS. 11-14 illustrate stages in a manufacturing process for making one structure for a 3D memory as described herein.

FIG. 10 shows a cross-sectional view of a stacked memory structure of an alternative configuration, wherein the conductive layers comprise phase change materials, with memory cells programmed to have amorphous volumes of varying sizes in the conductive layers. The varying sizes in amorphous volumes cause the cells to have resistances that fall within different resistance ranges that correspond to the data values stored. The stacked memory structure includes a conductive pillar 630. The pillar 630 extends through a top insulating layer 636, a plurality of conductive layers 632-1 through 632-8 and a plurality of insulating layers (e.g. 634) separating the plurality of conductive layers. The programmable elements of each memory cell are located in a portion of memory material in the corresponding conductive layer. Each of the conductive layers of the plurality of conductive layers is coupled to a layer decoder 658.

The stacked memory structure includes eight memory cells, in this example: 640, 642, 644, 646, 648, 650, 652 and 654. Memory cells are formed in corresponding conductive layers 632-1 to 632-8 at the interface with the pillar 630. An access device 651 in the access layer is shown schematically for selecting the illustrated pillar.

The memory cells 640, 642, 644, 646, 648, 650, 652 and 654 each have a ring-shaped amorphous phase volume 635, 637, 639, 641, 643, 645, 647, and 649, of phase change material in the interface formed around the inside perimeter of the corresponding conductive layer 632-1 through 632-8. The resistance of each memory cell depends in part on the size of the amorphous phase volume. In this example, the memory cells 640, 644, 648 and 652 have a resistance that falls within a first resistance range which can correspond to a data value "0," as represented by the smaller size of the amorphous phase volumes 635, 639, 643 and 647. The memory cells 642, 646, 650 and 654 have a resistance that falls within a second, higher resistance range which can correspond to a data value "1," as represented by the larger size of the amorphous phase volumes 637, 641, 645 and 649.

FIGS. 11-14 illustrate stages in the manufacturing process for a 3D memory structure as described herein. The manufacturing process involves forming an access array 700 on a substrate, which can be accomplished using CMOS technology, for example, standard horizontal transistors or vertical transistors as illustrated in FIG. 1. In the example shown in FIG. 11, the process included forming an interlayer dielectric 702 over the access array, and forming contact plugs 704, 706 through the interlayer dielectrics 702. The top surfaces of the contact plugs 704, 706 are exposed at the top of the interlayer dielectrics 702. Over the interlayer dielectrics 702, alternating layers of a insulating material (insulators 720, 722, 724, 726) and a conductive material (708, 710, 712, 714) are formed. A capping dielectric layer 728 is formed over the top layer of conductive material. The dielectric material can comprise a silicon nitride, a silicon oxide, other insulating materials compatible with the materials used to form the memory and by combinations of dielectric materials. The conductive material used to form the conductive layer 708, 710, 712, 714 comprises a conductive "heater" material, such as a titanium nitride, a titanium aluminum nitride, a tantalum nitride and so on. In other embodiments, the conductive layer can comprise a refractory metal such as tungsten. In other embodiments, the conductive layers can comprise conductors like copper, or aluminum that have lower resistivity. These conductive layers are deposited in a blanket deposition process which can be selected according to the chosen materials, forming planar conductors alternating with insulating layers over the tops of the contact plugs 704, 706. Of course, in an implementation of the memory, there can be an array of thousands or millions of contact plugs beneath a stack of conductive layers.

Figure 12:
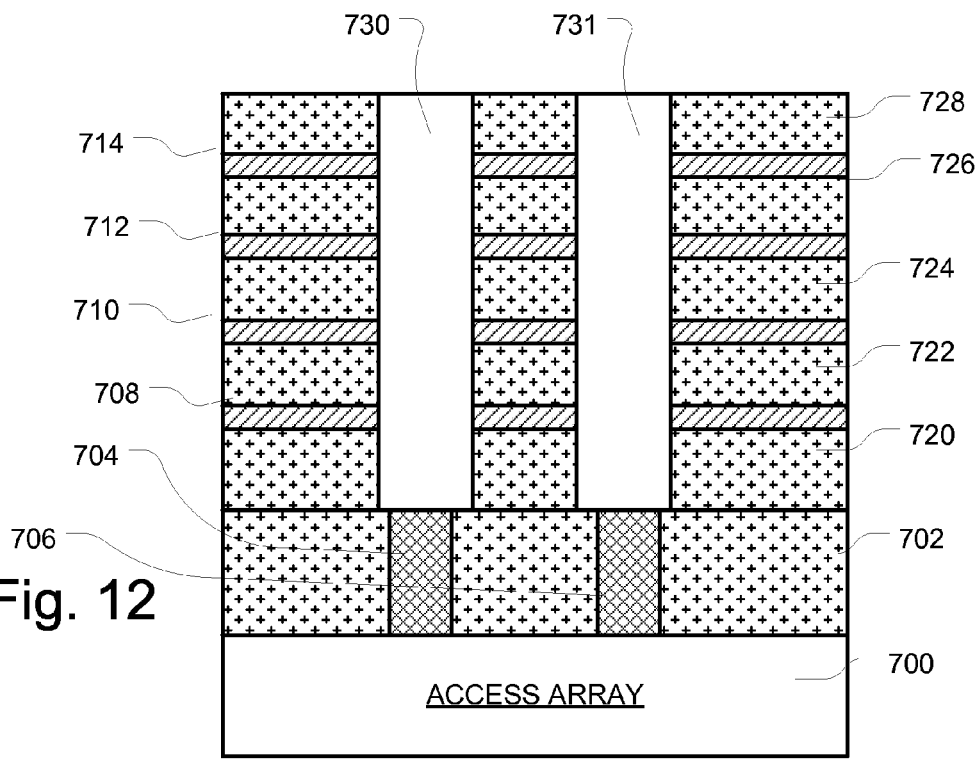

FIG. 12 illustrates a stage in the manufacturing process after etching holes 730, 731 through the stack of conductive layers, exposing the contact plugs 704, 706. The holes 730, 731 can be circular, or have other shapes such as rectangular shapes and the like, depending on the manufacturing techniques used to form them. Preferably, the sidewalls of the holes 730, 731 are as vertical as practical.

Figure 13:
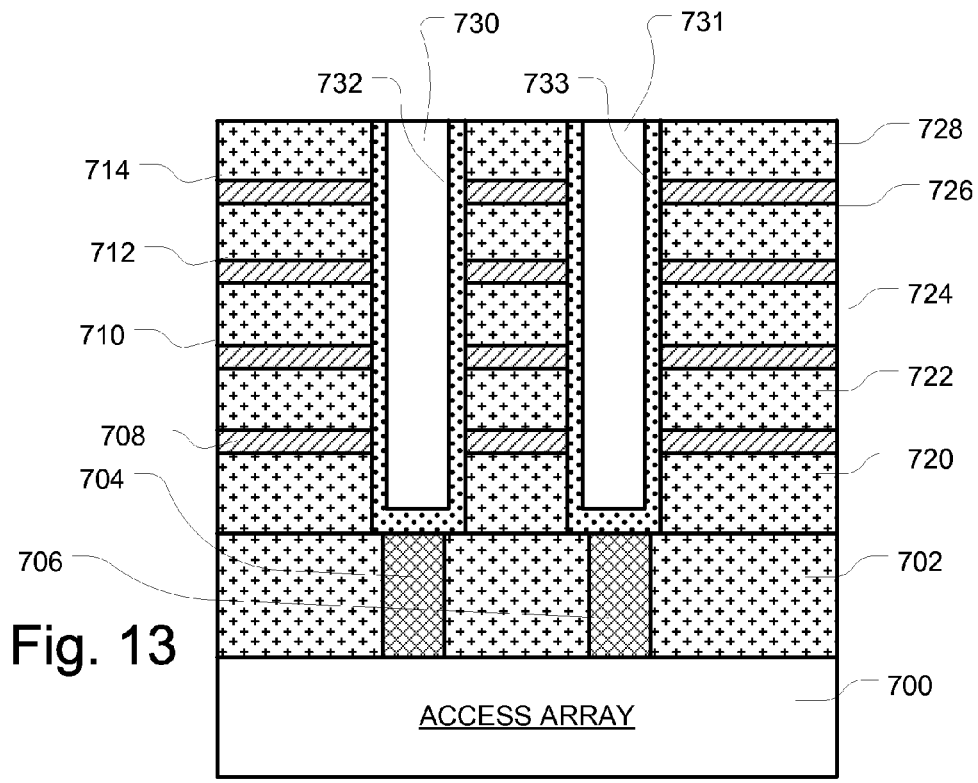

A next stage in the manufacturing process includes forming liners 732, 733 within the holes 730, 731, as shown in FIG. 13, which comprise a phase change material selected to act as the memory element for the memory cells at the interfaces with the conductive layers. In a preferred embodiment, the phase change material can comprise a relatively high resistance, for a crystalline phase, as deposited material like a germanium rich $Ge_xSb_yTe_z$. The high resistance, as deposited, facilitates an initialization step in which all of the memory cells are initialized so that they include at least a small volume of amorphous material to control interlayer leakage as discussed above.

Figure 14:
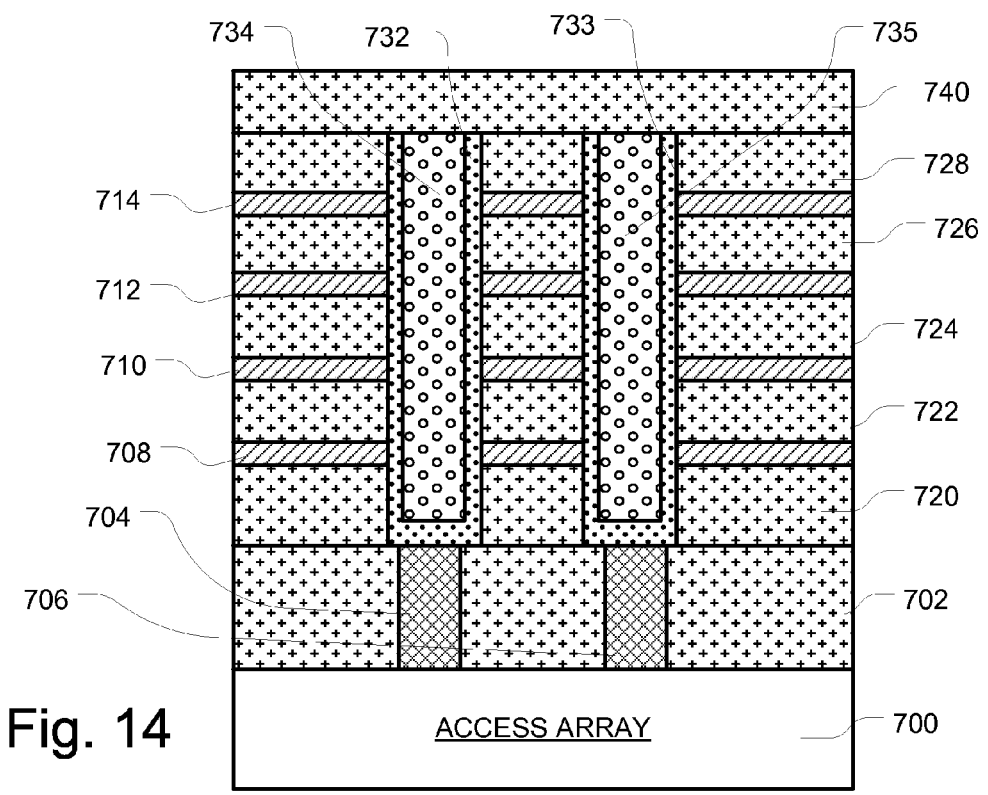

FIG. 14 illustrates a later stage in the process, after filling the remaining parts of the holes with a core 734, 735 of conductive material, such as a crystalline phase phase change material. In one example process, the liner 732, 733 can be deposited as a germanium-rich $Ge_xSb_yTe_z$. Then, the after formation of a liner of sufficient thickness, the deposition recipe can be changed to a species of $Ge_xSb_yTe_z$ with less germanium. In alternatives, as discussed above, the core 734, 735 of the pillar can comprise different types of conductive materials.

As illustrated in FIG. 14, after forming the pillars, the material can be planarized and a capping insulator 740 can be formed over the stack.

Figure 15:
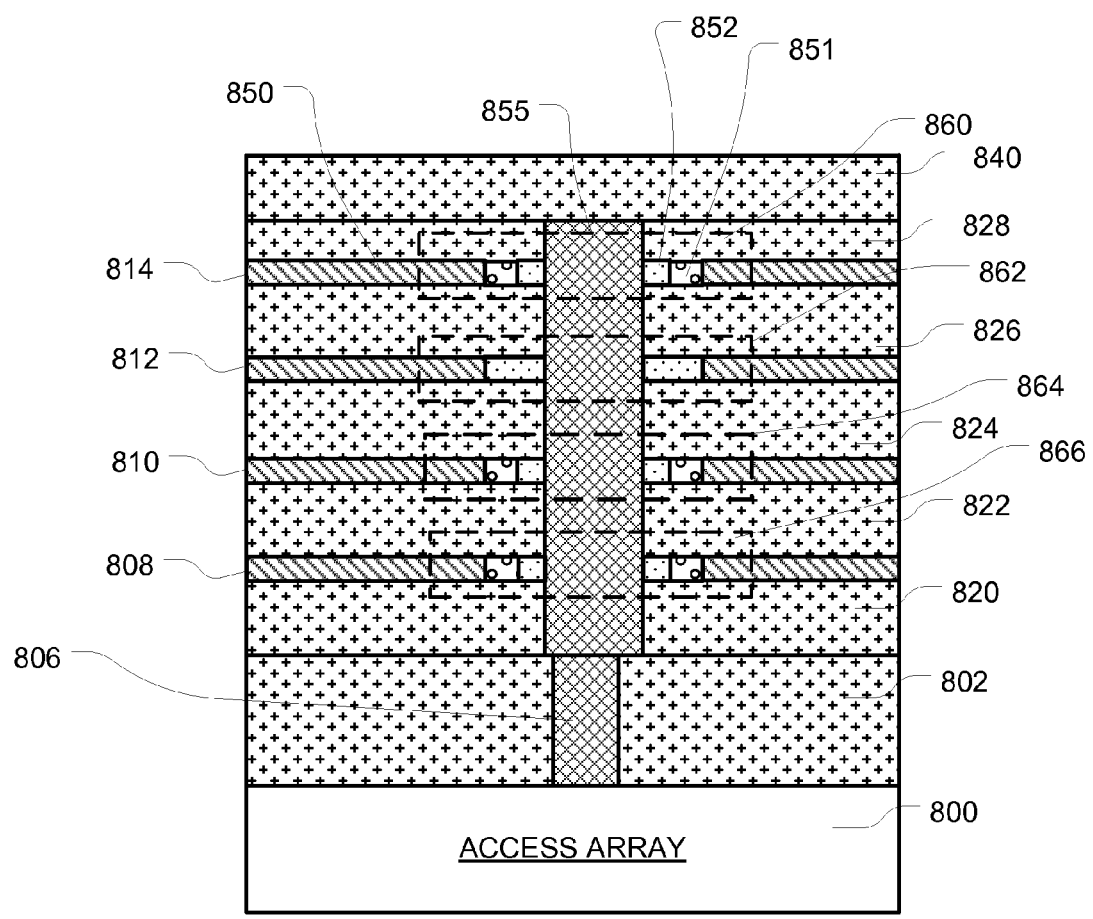
FIG. 15 illustrates a stage in a manufacturing process for making an alternative structure for 3D memory as described herein.

FIG. 15 illustrates yet another alternative structure for the 3D memory as described herein. In the structure, the device includes an access array 800 with an overlying interlayer dielectric 802, and a conductive plug 806 extending therethrough. An alternating stack of insulating layers 820, 822, 824, 826, 828 and conductive layers 808, 810, 812, 814 is deposited in a blanket form. In this example, however, the blanket conductive layers are patterned to provide patches of phase change material in the locations at which the holes for the pillars are to be formed. In this manner, the memory cells include a patch of phase change material 851 which surrounds the pillar 855. The balance of the conductive layer 850 comprises a conductor compatible with the phase change material, such as a titanium nitride, a metal or another compatible conductive material. Amorphous phase volumes 852 are formed on the inside perimeter of the patches 851 of phase change material at the interface with the conductive pillar 855.

The example illustrated in FIG. 15 includes four memory cells 860, 862, 864, 866. Each of the cells has an amorphous phase volume which corresponds to the data value. In this example, the memory cells 860, 864 and 866 have a smaller amorphous phase volume which corresponds to a lower resistance range, while the memory cell 862 has a larger amorphous phase volume which corresponds to a higher resistance range. In the example, the entire "patch" of phase change material can be set in the amorphous phase to establish the highest one of the resistance ranges used to represent a data value.

Figure 16A:
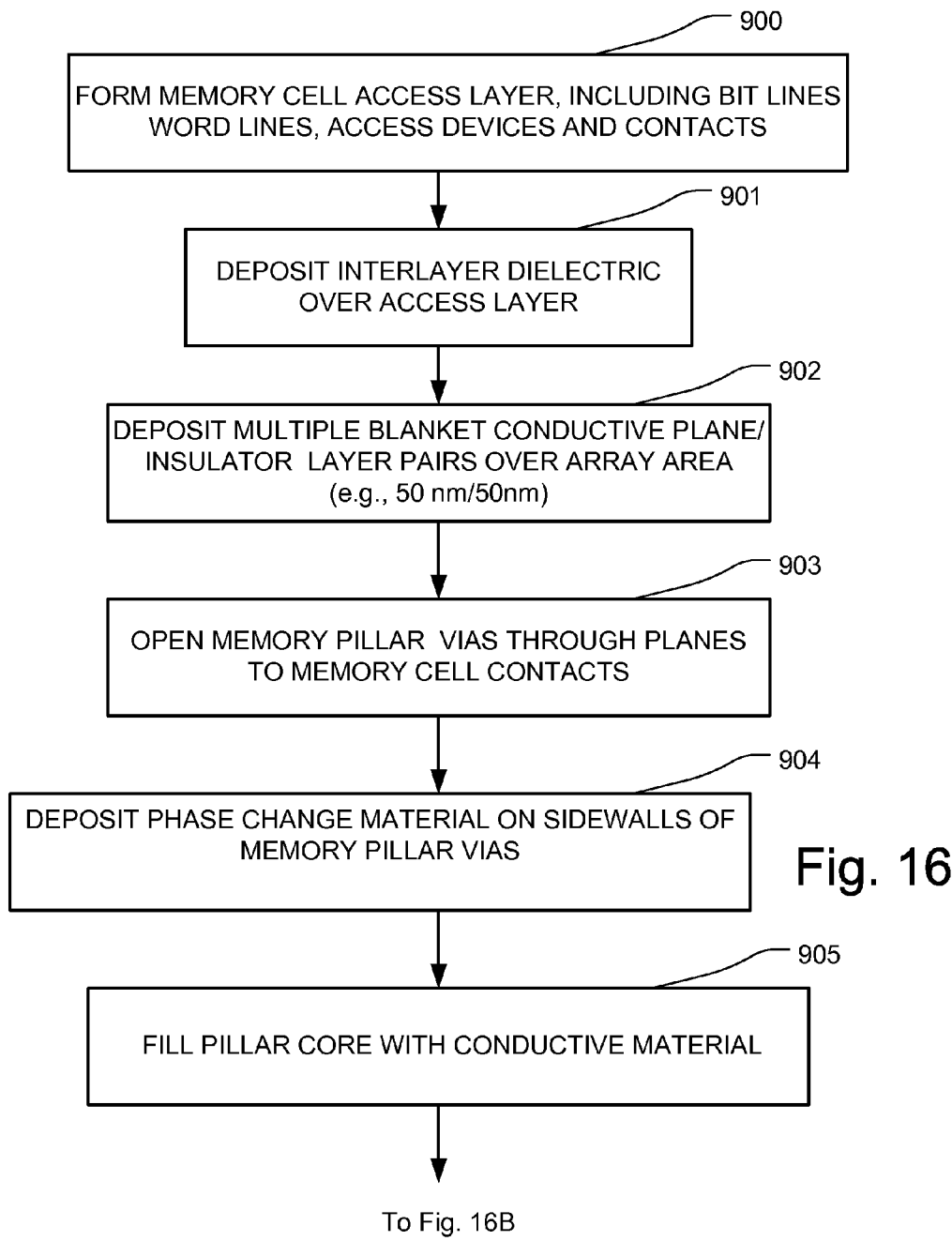
FIGS. 16A-16B are respective parts of a flow chart for a manufacturing process usable to make a 3D memory.
Figure 16B:
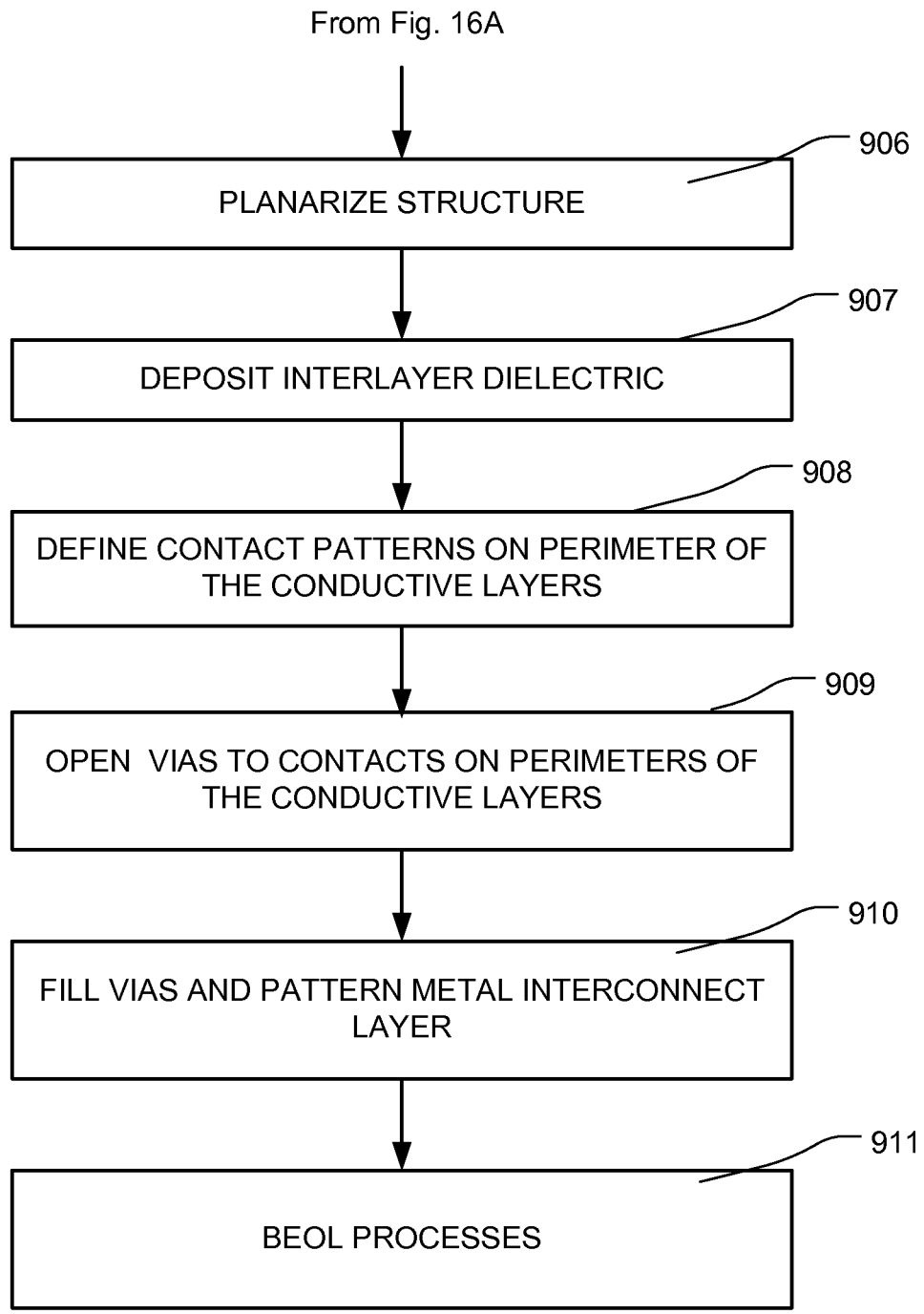

FIGS. 16A and 16B include a flow chart for a manufacturing method which can be applied to make the structure as shown with respect to FIGS. 11-14. For the purposes of this application, the first step 900 involves forming the memory cell access layer, including bit lines, word lines, access devices and contacts. At this stage, peripheral circuitry on the integrated circuit substrate is also formed. As a result of this process, a top surface of the memory cell access layer in the memory region of the device has an array of contacts, including contact plugs 704, 706 of FIG. 11. At this stage, standard CMOS manufacturing techniques could have been applied including all the necessary patterning and etching steps needed for forming the peripheral circuitry and the access devices. The contacts and interconnects involved in the memory cell access layer should be made using a refractory metal, such as tungsten, so that the thermal budget involved in the deposition of a large number of layers of conductive materials will not interfere with the underlying interconnects.

Next, an interlayer insulator (e.g. 720) is deposited over the memory cell access layer (901). The interlayer insulator can be silicon dioxide, silicon oxide nitride, silicon nitride or other interlayer dielectric materials. Next, alternating blanket depositions of conductive layers and insulator layers are performed (902). These blanket depositions provide the plurality of conductive layers (e.g. 708, 710, 712, 714) acting as electrode planes. The conductive layers can be relatively highly doped n-type polysilicon (n+ polysilicon), heater material, metal, phase change material or other conductive materials depending on the configuration chosen. A typical thickness for the conductive layers can be on the order of 50 nanometers. The insulating layers form the insulation between the conductive layers. The thicknesses of the insulating layers can also be on the order of 50 nanometers in one example. Other examples will include larger or smaller thicknesses for the conductive materials, and insulating layers as desired or required for particular implementations. In a next stage, a lithographic pattern is applied to define and open vias for the memory cell pillars through the plurality of conductive planes to corresponding contacts on the memory cell access layer (903). A reactive ion etching process can be applied to form deep, high aspect ratio holes through the silicon dioxide and conductive layers to provide vias for the pillars.

After opening the vias, a liner of phase change material is deposited on the side walls of the pillar vias (904). The phase change material can be deposited using atomic layer deposition or chemical vapor deposition technologies. Suitable materials include chalcogenides such as germanium rich GexSbyTez. The typical thickness for a layer of phase change material can be on the order of 5 to 50 nanometers, more or less.

The resulting layers of material can be anisotropically etched to open the bottom of the pillar via, exposing the underlying contact. In a next step, the center electrode material is deposited within the pillar via (905).

Continuing to FIG. 16B, after depositing the center electrode material, the resulting structure is etched back using a chemical mechanical polishing process or other planarizing process (906).

Next, an interlayer dielectric is deposited over the structure (block 907).

After forming the plurality of conductive layers, contact areas are defined on the perimeters of the conductive layers using a taper etch process (908). After patterning the perimeters of the conductive layers, an insulating fill is deposited and planarized over the structure. Then, vias are opened through the insulating fill to contacts on the perimeters of the conductive layers (909).

The vias are filled using tungsten or other contact material, and metallization processes are applied to provide interconnection between the contacts to the conductive layers and plane decoding circuitry on the device (910). Finally, back end of line BEOL processes are applied to complete an integrated circuit (911).

Figure 17:
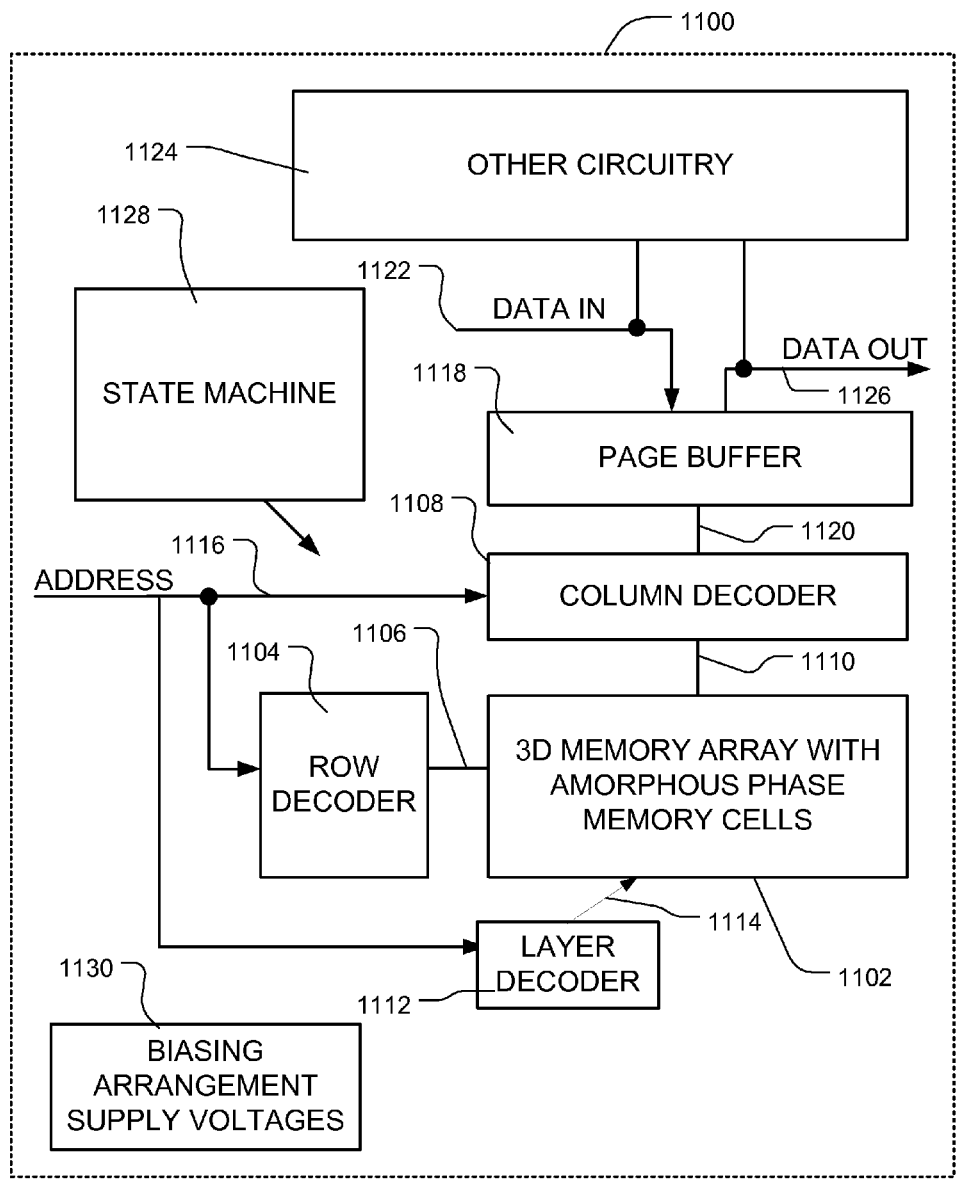
FIG. 17 is a simplified block diagram of an integrated circuit according to an embodiment of the present invention.

FIG. 17 is a simplified block diagram of an integrated circuit according to an embodiment of the present invention. The integrated circuit line 1100 includes a 3D memory array 1102 with memory cells programmed to resistances in various resistance ranges that are greater than or equal to the threshold high resistance range. A row decoder 1104 is coupled to a plurality of word lines 1106, and arranged along rows in the memory array 1102. A column decoder 1108 is coupled to a plurality of bit lines 1110 arranged along columns in the memory array 1102 for reading and programming data to and from the memory cells in the array 1102. A layer decoder 1112 is coupled to a plurality of electrode planes in the memory array 1102 on line 1114. Addresses are supplied on bus 1116 to column decoder 1108, row decoder 1104 and layer decoder 1112. A page buffer 1118 is coupled to the column decoder 1108 in this example via data bus 1120. Data is supplied via the data-in line 1122 from input/output ports on the integrated circuit or from other data sources internal or external to the integrated circuit, to page buffer 1118. In the illustrated embodiment, other circuitry 1124 is included on the integrated circuit, such as a general purpose processor or special purpose application circuitry, or a combination of modules providing system-on-a-chip functionality. Data is supplied via the data-out line 1126 from the page buffer 1118 to input/output ports on the integrated circuit, or to other data destinations internal or external to the integrated circuit.

A controller implemented in this example using bias arrangement state machine 1128 controls the application of bias arrangement supply voltage generated or provided through the voltage supply or supplies in block 1130, such as program voltages to program the memory cells according to the previously described programming techniques. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller. The controller is configured to program data in the memory cells having data values represented by a plurality of non-overlapping ranges of resistance, said plurality of non-overlapping ranges of resistance including a lowest resistance range of resistance, being established by respective amorphous phase thicknesses of the phase change memory material across the current paths in the memory cells. Using the voltage supply or supplies in block 1130 and logic circuitry, the controller is configured to apply a program pulse to a selected memory cell having a pulse shape that depends on the resistance range of the memory cell before applying the program pulse, and the target resistance range for the memory cell after the programming pulse. The logic in the controller can include sequencing logic for an operation to determine a resistance range of a selected memory cell, and a pulse forming circuit to generate a program pulse having a pulse shape, like those of FIGS. 6A-6D and 7A-7C, selected in response to the determined resistance and a target resistance range.

An all-amorphous, multibit-per-cell, phase change memory cell configured in a 3D memory structure is described. A word line and a bit line to decode a transistor or other access device are included in an access array, which is connected to a memory pillar. The memory pillar extends through planar conductors, with phase change memory cells in the interfaces at cross-points of the planar conductors and the pillars.

The side wall of the memory pillar is contacted around its perimeter by multiple stacked conductive layers. At each cross-point, a memory cell is formed including a current path between corresponding pillars and conductive layers.

In order to isolate leakage current between each layer, only amorphous phase volumes having different thicknesses across the current paths in the phase change materials are used to store the data.

A programming procedure is used in this invention in order to program all amorphous states. The memory cell structures, manufacturing methods and operating methods described herein are suitable for high density 3D memory arrays. However, the technology is applicable to single layer arrays, and smaller sets of phase change memory cells.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for manufacturing a memory device, comprising:
    forming an array of access devices;
    forming a plurality of conductive layers under or over the array of access devices, separated from each other and from the array of access devices by insulating layers;
    forming an array of pillars extending through the plurality of conductive layers, the pillars in the array contacting corresponding access devices in the array of access devices, and defining interface regions between the pillar and conductive layers in the plurality of conductive layers;
    forming memory elements in the interface regions including a current path between corresponding pillars and conductive layers, each of said memory elements comprising a phase change material; and forming circuitry coupled to the array of access devices and the plurality of conductive layers configured to program data in the memory elements, the data having one of N data values represented by N non-overlapping ranges of resistance;

wherein N is greater than or equal to two;

wherein N different thicknesses of amorphous phase of the phase change material in the memory elements correspond to the N data values; and wherein a state of the memory cell comprising no volume of amorphous phase of the phase change material in the current path does not correspond to a stored data value.

2. The method of claim 1, wherein said forming a plurality of conductive layers includes blanket deposition of phase change material.

3. The method of claim 1, wherein said forming a plurality of conductive layers includes blanket deposition of conductive material, followed by formation of a plurality of patches of phase change material.

4. The method of claim 1, wherein said forming a plurality of conductive layers includes:
forming a plurality of blanket layers of conductive material; and
forming blanket layers of insulating material between the blanket layers of conductive material.

5. The method of claim 1, wherein said forming an array of pillars includes:
defining a via through the plurality of conductive layers;
depositing a layer of a first phase change material on sidewalls of the via; and
filling the via over the layer of the first phase change material with a second phase change material.

6. A method for operating a memory device including a plurality of phase change memory cells, comprising:
receiving data to program to a selected phase change memory cell, the data having one of N data values to be stored in the selected cell, wherein N is greater than or equal to two; and
applying a programming pulse through the selected phase change memory cell, the programming pulse being configured to program the data in the memory cells, the N data values represented by N non-overlapping ranges of resistance, wherein N different thicknesses of amorphous phase of phase change material in the selected phase change memory cell correspond to the N data values, and wherein a state of the selected phase change memory cell comprising no volume of amorphous phase of the phase change material does not correspond to a stored data value.

7. The method of claim 6, wherein the memory device including a 3D array of phase change memory cells at interface regions where vertical conductive pillars extend through a plurality of conductive layers, and applying said programming pulse includes applying the pulses through corresponding pillars and conductive layers.

8. The method of claim 6, wherein said applying a programming pulse includes determining a resistance range of a selected memory cell, and forming said programming pulse so that it has a pulse shape selected in response to the determined resistance and a target resistance range.

9. The method of claim 6, wherein the programming pulse has a pulse shape that depends on the resistance range of the memory cell before applying the programming pulse, and a target resistance range for the memory cell after the programming pulse.

10. A memory device, comprising:
a first conductor;
a second conductor; and
a memory cell comprising phase change memory material in an interface between the first and second conductors, wherein data is stored in the memory cell, the data having one of N data values represented by N non-overlapping ranges of resistance, wherein N is greater than or equal to two;
wherein N different thicknesses of amorphous phase of the phase change material in the memory elements correspond to the N data values; and wherein a state of the memory cell comprising no volume of amorphous phase of the phase change material in the current path does not correspond to a stored data value.

11. The memory device of claim 10, including:
an access device coupled to the first conductor; and
circuitry coupled to the access device and the second conductor configured to program data in the memory cell having data values represented by a plurality of non-overlapping ranges of resistance, said plurality of non-overlapping ranges of resistance established by different amorphous phase thicknesses of the phase change memory material in the memory cells.

12. A memory device, comprising:
a memory cell comprising phase change material in a current path between a first and a second electrode; and
circuitry coupled to the memory cell configured to program data in the memory cell, the data having one of N data values represented by N non-overlapping ranges of resistance,
wherein N is greater than or equal to two;
wherein N different thicknesses of amorphous phase of the phase change material in the current path correspond to the N data values; and
wherein a state of the memory cell comprising no volume of amorphous phase of the phase change material in the current path does not correspond to a stored data value.

13. The memory device of claim 12, said circuitry configured to program data is configured to apply a program pulse to the memory cell having a pulse shape that depends on the resistance range of the memory cell before applying the program pulse, and a target resistance range for the memory cell after the program pulse.

14. The memory device of claim 12, said circuitry configured to program data includes logic to determine a resistance range of the memory cell, and a pulse forming circuit to generate a program pulse having a pulse shape selected in response to the determined resistance and a target resistance range.

15. The memory device of claim 13, wherein the target resistance range is lower than the resistance range of the memory cell before applying the pulse.

16. The memory device of claim 13, wherein the program pulse is suitable for decreasing the thickness of the amorphous phase volume, from a first thickness to a second thickness;
wherein the first thickness corresponds to a first data value of the N data values and the second thickness corresponds to a second data value of the N data values.

17. The memory device of claim 13, wherein the program pulse has a shape including a first portion configured to crystallize at least of portion of an amorphous phase volume in the memory cell and a second portion configured to set a thickness of amorphous phase in the memory cell so that the resistance range of the memory cell after the program pulse is within the targeted resistance range.

* * * * *